(12) United States Patent
Axelrod et al.

(10) Patent No.: US 11,604,347 B2
(45) Date of Patent: Mar. 14, 2023

(54) FORCE-BALANCED MICROMIRROR WITH ELECTROMAGNETIC ACTUATION

(71) Applicant: Apple Inc., Cupertino, CA (US)

(72) Inventors: Noel Axelrod, Jerusalem (IL); Raviv Erlich, Kibbutz Beit Nir (IL); Yuval Gerson, Sunnyvale, CA (US)

(73) Assignee: APPLE INC., Cupertino, CA (US)

(*) Notice: Subject to any disclaimer, the term of this patent is extended or adjusted under 35 U.S.C. 154(b) by 360 days.

(21) Appl. No.: 16/896,245

(22) Filed: Jun. 9, 2020

(65) Prior Publication Data

US 2021/0048662 A1     Feb. 18, 2021

Related U.S. Application Data

(60) Provisional application No. 62/888,485, filed on Aug. 18, 2019.

(51) Int. Cl.
| | |
|---|---|
| *B81B 3/00* | (2006.01) |
| *G02B 26/08* | (2006.01) |
| *G02B 26/10* | (2006.01) |

(52) U.S. Cl.
CPC ............ *G02B 26/085* (2013.01); *B81B 3/004* (2013.01); *B81B 3/0018* (2013.01); *B81B 3/0067* (2013.01); *G02B 26/105* (2013.01); *B81B 2201/04* (2013.01)

(58) Field of Classification Search
CPC .......................... B81B 2201/04; G02B 26/085
See application file for complete search history.

(56) References Cited

U.S. PATENT DOCUMENTS

| | | | |
|---|---|---|---|
| 3,918,068 A | 11/1975 | Reinke et al. | |
| 3,973,825 A | 8/1976 | Starkweather | |
| 4,003,626 A | 1/1977 | Reinke et al. | |

(Continued)

FOREIGN PATENT DOCUMENTS

| | | | |
|---|---|---|---|
| CN | 1621322 A | 6/2005 | |
| CN | 101308343 A | 11/2008 | |

(Continued)

OTHER PUBLICATIONS

EP Application # 15826002.6 Office Action dated May 14, 2021.

(Continued)

*Primary Examiner* — Moazzam Hossain

(74) *Attorney, Agent, or Firm* — Kligler & Associates Patent Attorneys Ltd

(57) ABSTRACT

A scanning device includes a planar scanning mirror disposed within a frame and having a reflective upper surface. A pair of flexures have respective first ends connected to the frame and respective second ends connected to the mirror at opposing ends of a rotational axis of the mirror. A rotor including a permanent magnet is disposed on the lower surface of the mirror. A stator includes first and second cores disposed in proximity to the rotor on opposing first and second sides of the rotational axis and first and second coils of wire wound respectively on the cores. A drive circuit drives the first and second coils with respective electrical currents including a first component selected so as to control a transverse displacement of the mirror and a second component selected so as to control a rotation of the mirror about the rotational axis.

20 Claims, 5 Drawing Sheets

(56) References Cited

U.S. PATENT DOCUMENTS

| | | |
|---|---|---|
| 5,608,468 A | 3/1997 | Gove |
| 5,629,790 A | 5/1997 | Neukermans et al. |
| 5,635,708 A | 6/1997 | Obata |
| 5,742,419 A | 4/1998 | Dickensheets et al. |
| 5,847,859 A | 12/1998 | Murata |
| 5,938,989 A | 8/1999 | Hambright |
| 6,140,979 A | 10/2000 | Gerhard et al. |
| 6,426,013 B1 | 7/2002 | Neukermans |
| 6,517,751 B1 | 2/2003 | Hambright |
| 6,540,361 B1 | 4/2003 | Hayashi et al. |
| 6,603,894 B1 | 8/2003 | Pu |
| 6,753,638 B2 | 6/2004 | Adams et al. |
| 6,825,967 B1 | 11/2004 | Chong et al. |
| 6,882,770 B2 | 4/2005 | Neilson et al. |
| 6,941,034 B2 | 9/2005 | Kuboi |
| 7,609,875 B2 | 10/2009 | Liu et al. |
| 7,952,781 B2 | 5/2011 | Weiss et al. |
| 8,018,579 B1 | 9/2011 | Krah |
| 8,437,063 B2 | 5/2013 | Weiss et al. |
| 8,624,177 B2 | 1/2014 | Campion et al. |
| 8,752,969 B1 | 6/2014 | Kane et al. |
| 8,797,623 B2 | 8/2014 | Weiss et al. |
| 9,462,255 B1 | 10/2016 | Marason et al. |
| 9,703,096 B2 | 7/2017 | Shpunt et al. |
| 9,784,838 B1 | 10/2017 | Shpunt et al. |
| 9,835,853 B1 | 12/2017 | Shpunt et al. |
| 10,168,530 B2 | 1/2019 | Gerson et al. |
| 10,247,812 B2 | 4/2019 | Shpunt et al. |
| 10,330,921 B2 | 6/2019 | Erlich et al. |
| 10,488,652 B2 | 11/2019 | Shpunt et al. |
| 2002/0070335 A1 | 6/2002 | Orcrutt et al. |
| 2002/0071169 A1 | 6/2002 | Bowers et al. |
| 2002/0075786 A1 | 6/2002 | Ikegame et al. |
| 2002/0125324 A1 | 9/2002 | Yavid et al. |
| 2003/0137711 A1 | 7/2003 | Yagi et al. |
| 2003/0162313 A1 | 8/2003 | Kim et al. |
| 2004/0004775 A1 | 1/2004 | Turner |
| 2004/0021852 A1 | 2/2004 | Deflumere |
| 2004/0040648 A1 | 3/2004 | Harden et al. |
| 2004/0063235 A1 | 4/2004 | Chang |
| 2004/0070816 A1 | 4/2004 | Kato et al. |
| 2004/0081391 A1 | 4/2004 | Ko et al. |
| 2004/0105139 A1 | 6/2004 | Hirose et al. |
| 2004/0207744 A1 | 10/2004 | Bock |
| 2004/0214350 A1 | 10/2004 | Pan et al. |
| 2005/0046504 A1 | 3/2005 | Xiaoyu et al. |
| 2005/0078169 A1 | 4/2005 | Turner |
| 2007/0064293 A1 | 3/2007 | Turner et al. |
| 2008/0143196 A1 | 6/2008 | Sprague et al. |
| 2008/0225368 A1 | 9/2008 | Ciabattoni et al. |
| 2008/0278785 A1 | 11/2008 | Klose et al. |
| 2009/0002678 A1 | 1/2009 | Tanaka et al. |
| 2009/0161177 A1 | 6/2009 | Nomura |
| 2009/0284817 A1 | 11/2009 | Orcutt |
| 2009/0294638 A1 | 12/2009 | Mohanty et al. |
| 2010/0046052 A1 | 2/2010 | Mizoguchi et al. |
| 2010/0046054 A1 | 2/2010 | Jeong et al. |
| 2010/0142020 A1 | 6/2010 | Kim |
| 2010/0182667 A1 | 7/2010 | Ishida |
| 2010/0253989 A1 | 10/2010 | Shimizu et al. |
| 2010/0302617 A1 | 12/2010 | Zhou |
| 2011/0188054 A1 | 8/2011 | Petronius et al. |
| 2011/0205609 A1 | 8/2011 | Mizoguchi |
| 2011/0228251 A1 | 9/2011 | Yee et al. |
| 2011/0228367 A1 | 9/2011 | Lubianiker et al. |
| 2011/0279648 A1 | 11/2011 | Lutian et al. |
| 2011/0310125 A1 | 12/2011 | McEldowney et al. |
| 2011/0310452 A1 | 12/2011 | Lin |
| 2012/0236379 A1 | 9/2012 | Dasilva et al. |
| 2012/0250124 A1 | 10/2012 | Choi et al. |
| 2012/0307211 A1 | 12/2012 | Hofmann et al. |
| 2013/0063799 A1* | 3/2013 | Honda ............... H02K 33/16 359/200.7 |
| 2013/0127854 A1 | 5/2013 | Shpunt et al. |
| 2013/0206967 A1 | 8/2013 | Shpunt et al. |
| 2013/0207970 A1 | 8/2013 | Shpunt et al. |
| 2013/0301101 A1 | 11/2013 | Conrad et al. |
| 2013/0328140 A1 | 12/2013 | Potasek et al. |
| 2014/0078514 A1 | 3/2014 | Zhu |
| 2014/0153001 A1 | 6/2014 | Chayat et al. |
| 2014/0226145 A1 | 8/2014 | Steffey et al. |
| 2014/0253994 A1 | 9/2014 | Benner, Jr. |
| 2014/0291491 A1 | 10/2014 | Shpunt et al. |
| 2014/0291496 A1 | 10/2014 | Shpunt et al. |
| 2014/0310914 A1 | 10/2014 | Erlich et al. |
| 2014/0313519 A1 | 10/2014 | Shpunt et al. |
| 2015/0204650 A1* | 7/2015 | Erlich ............... G02B 26/0833 324/686 |
| 2015/0234179 A1 | 8/2015 | Shpunt |
| 2016/0105090 A1* | 4/2016 | Sadaharu ............ G02B 26/101 310/38 |
| 2016/0146939 A1 | 5/2016 | Shpunt et al. |
| 2016/0178895 A1 | 6/2016 | Gerson et al. |
| 2016/0238834 A1 | 8/2016 | Erlich et al. |
| 2017/0090186 A1 | 3/2017 | Gerson et al. |

FOREIGN PATENT DOCUMENTS

| | | |
|---|---|---|
| DE | 102011113147 B3 | 1/2013 |
| DE | 102017212384 A1 | 1/2019 |
| EP | 1361470 A2 | 11/2003 |
| EP | 1548487 A1 | 6/2005 |
| EP | 1953583 A2 | 8/2008 |
| EP | 2333603 A1 | 6/2011 |
| EP | 2363686 A1 | 9/2011 |
| GB | 2271436 A | 4/1994 |
| JP | 2004191918 A | 7/2004 |
| JP | 2012242477 A | 12/2012 |
| KR | 100867147 B1 | 11/2008 |
| WO | 2002047241 A1 | 6/2002 |
| WO | 03/049156 A2 | 6/2003 |
| WO | 2005078509 A2 | 8/2005 |
| WO | 2012013536 A1 | 2/2012 |
| WO | 2012020380 A1 | 2/2012 |
| WO | 2013045699 A1 | 4/2013 |
| WO | 2014016794 A1 | 1/2014 |
| WO | 2014064606 A1 | 5/2014 |

OTHER PUBLICATIONS

International Application # PCT/US2020/036718 Search Report dated Sep. 16, 2020.

Judy et al., "Magnetic Microactuation of Polysilicon Flexure Structures," Solid-State Sensor and Actuator Workshop, pp. 1-10, year 1994.

Judy et al., "Magnetically Actuated, Addressable Microstructures," Journal of Microelectromechanical Systems, vol. 6, No. 3, pp. 249-256, Sep. 1997.

Cho et al., "A Scanning Micromirror Using a Bi-Directionally Movable Magnetic Microactuator," Proceedings of SPIE, MOEMS and Miniaturized Systems, vol. 4178, pp. 106-115, USA 2000.

Hamamatsu Photonics K.K., "Position sensitive detectors", pp. 1-7, Japan, Feb. 2010.

Gale, M.T., "Replication Technology for Diffractive Optical Elements", Proceedings of SPIE, vol. 3010, pp. 111-123, May 15, 1997.

Kolste et al., "Injection Molding for Diffractive Optics", Proceedings of SPIE, vol. 2404, pp. 129-131, Feb. 9, 1995.

Gale et al., "Replicated Microstructures for Integrated Topics", Proceedings of SPIE, vol. 2513, pp. 2-10, Aug. 29, 1994.

Jahns et al., "Diffractive Optics and Micro-Optics: Introduction to the Feature Issue", Applied Optics Journal, vol. 36, No. 20, pp. 4633-4634, Jul. 10, 1997.

Nikolejeff et al., "Replication of Continuous Relief Diffractive Optical Elements by Conventional Compact Disc Injection-Molding Techniques", Applied Optics Journal, vol. 36, No. 20, pp. 4655-4659, Jul. 10, 1997.

Neyer et al., "New Fabrication Technology for Polymer Optical Waveguides", Integrated Photonics Research, pp. 248-249, year 1992.

(56) References Cited

OTHER PUBLICATIONS

Neyer et al., "Fabrication of Low Loss Polymer Waveguides Using Injection Moulding Technology", Electronics Letters, vol. 29, No. 4, pp. 399-401, Feb. 18, 1993.
Minifaros, "D1.1—ProjectPresentation", V3.0, pp. 1-36 pages, Dec. 22, 2010.
Lintec Corporation, "Adwill D-510T Tape", pp. 1-2, Japan, Apr. 4, 2006.
Stark, B., "MEMS Reliability Assurance Guidelines for Space Applications", pp. 1-312, Jet Propulsion Laboratory, California Institute of Technology, Pasadena, USA, Jan. 1999.
Fraunhofer Institute for Photonic Microsystems, "Lamda—Large Aperture MEMS Scanner Module For 3D Distance Measurement"—Data sheet, Dresden, Germany, pp. 1-2, May 9, 2012.
Yang et al., "Phase synchronization of micro-mirror arrays using elastic linkages", Sensors and Actuators A, Elsevier Sequoia, vol. 95, No. 1, pp. 55-60, Dec. 15, 2001.
Fujita et al., "Dual-Axis MEMS Mirror for Large Deflection-Angle Using SU-8 Soft Torsion Beam," Sensors and Actuators A: Physical, vol. 121, issue 1, pp. 16-21, May 2005.
Stone et al., "Performance Analysis of Next-Generation LADAR for Manufacturing, Construction, and Mobility", National Institute of Standards and Technology, document # NISTIR 7117, pp. 1-198, Gaithersburg, USA, May 2004.
Sandner et al., "3D imaging using resonant large-aperture MEMS mirror arrays and laser distance measurement", Optical MEMs and Nanophotonics, IEEE/LEOS International Conference, pp. 78-79, Aug. 11, 2008.
Hah et al., "Theory and Experiments of Angular Vertical Comb-Drive Actuators for Scanning Micromirrors", IEEE Journal of Selected Topics in Quantum Electronics, vol. 10, No. 3, pp. 505-513, May/Jun. 2004.
Niclass et al., "Design and characterization of a 256x64-pixel single-photon imager in CMOS for a MEMS based laser scanning time-of-flight sensor", Optics Express, vol. 20, No. 11, pp. 11863-11881, May 21, 2012.
Sandner et al., "Large Aperture MEMS Segmented Scanner Module for LIDAR Systems", SPAR Conference—Europe, Amsterdam, pp. 1-48, Dec. 8, 2010.
Sandner et al., "Synchronized microscanner array for large aperture receiver optics of LIDAR systems", Proceedings of SPIE—The International Society for Optical Engineering, vol. 7594, 12 pages, Feb. 17, 2010.
Gruger et al., "New approach for MEMS scanning mirror for laser projection systems", SPIE Proceedings, vol. 6887, MOEMS and Miniaturized Systems VII, pp. 68870L-68870L, Feb. 8, 2008.

\* cited by examiner

FORCE-BALANCED MICROMIRROR WITH ELECTROMAGNETIC ACTUATION

CROSS-REFERENCE TO RELATED APPLICATION

This application claims the benefit of U.S. Provisional Patent Application 62/888,485, filed Aug. 18, 2019, which is incorporated herein by reference.

FIELD OF THE INVENTION

The present invention relates generally to miniaturized electromechanical devices, and particularly to miniature scanning mirrors and actuation of such mirrors.

BACKGROUND

Miniature scanning mirrors are used in scanning beams of light in a variety of applications, for example three-dimensional (3D) sensing and mapping. Mirrors of this sort having dimensions on the order of about a centimeter or less are commonly referred to as "micromirrors" by virtue of their small size. Such micromirrors can conveniently be produced using microelectromechanical systems (MEMS) technologies.

For example, U.S. Pat. No. 7,952,781 describes a method of scanning a light beam and a method of manufacturing a MEMS, which can be incorporated in a scanning device. In a disclosed embodiment, a rotor assembly having at least one micromirror is formed with a permanent magnetic material mounted thereon, and a stator assembly has an arrangement of coils for applying a predetermined moment on the at least one micromirror.

SUMMARY

Embodiments of the present invention that are described hereinbelow provide improved devices and methods for scanning a beam of light.

There is therefore provided, in accordance with an embodiment of the invention, a scanning device, including a frame and a planar scanning mirror disposed within the frame and having a reflective upper surface and a lower surface opposite the upper surface. A pair of flexures have respective first ends connected to the frame and respective second ends connected to the planar scanning mirror at opposing ends of a rotational axis of the planar scanning mirror. A rotor including a permanent magnet is disposed on the lower surface of the planar scanning mirror. A stator includes first and second cores disposed in proximity to the rotor on opposing first and second sides of the rotational axis of the planar scanning mirror and first and second coils of wire wound respectively on the first and second cores. A drive circuit is configured to drive the first and second coils with respective electrical currents including a first component selected so as to control a transverse displacement of the planar scanning mirror relative to a plane of the frame and a second component selected so as to control a rotation of the planar scanning mirror about the rotational axis.

In a disclosed embodiment, the flexures have a serpentine shape.

Additionally or alternatively, the first and second cores are magnetized with a polarity selected so as to repel the permanent magnet in the rotor. In a disclosed embodiment, the permanent magnet in the rotor and the first and second cores are poled in opposite directions along a magnetic axis perpendicular to the plane of the frame.

In some embodiments, the stator further includes third and fourth cores disposed in proximity to the rotor on opposing first and second sides of the rotational axis of the planar scanning mirror in respective proximity to the first and second cores, and third and fourth coils of wire wound respectively on the third and fourth cores. Typically, the drive circuit is coupled to drive the third and fourth coils together with the first and second coils, respectively.

In one embodiment, the device includes one or more capacitive sensors configured to output signals indicative of the transverse displacement and rotation of the planar scanning mirror, wherein the drive circuit is configured to generate the electrical currents responsively to the signals.

In some embodiments, the frame, the planar scanning mirror, and the flexures are etched from a silicon wafer. Additionally or alternatively, the frame, the planar scanning mirror, and the flexures include a metal having a thickness less than 100 μm.

In a disclosed embodiment, the drive circuit is coupled to drive the first and second coils such that the first component of the electrical currents flows through the first and second coils in a parallel direction, while the second component of the electrical currents flows through the first and second coils in an anti-parallel direction.

There is also provided, in accordance with an embodiment of the invention, a method for scanning, which includes mounting a planar scanning mirror, having a reflective upper surface and a lower surface opposite the upper surface, within a frame by connecting respective first ends of a pair of flexures to the frame and connecting respective second ends of the flexures to the planar scanning mirror at opposing ends of a rotational axis of the planar scanning mirror. A rotor including a permanent magnet is fixed to the lower surface of the planar scanning mirror. First and second cores of a stator, on which first and second coils of wire are respectively wound, are placed in proximity to the rotor on opposing first and second sides of the rotational axis of the planar scanning mirror. The first and second coils are driven with respective electrical currents including a first component selected so as to control a transverse displacement of the planar scanning mirror relative to a plane of the frame and a second component selected so as to control a rotation of the planar scanning mirror about the rotational axis.

In one embodiment, the frame, the planar scanning mirror, and the flexures are formed by etching a silicon wafer in a MEMS process.

Alternatively, the frame, the planar scanning mirror, and the flexures are formed by etching a sacrificial dielectric material, electroplating a metal onto the etched sacrificial dielectric material, and removing the sacrificial dielectric material in a LIGA process.

Further alternatively, the frame, the planar scanning mirror, and the flexures are formed by etching and cutting a metal sheet.

The present invention will be more fully understood from the following detailed description of the embodiments thereof, taken together with the drawings in which:

DETAILED DESCRIPTION OF EMBODIMENTS

Figure 1:
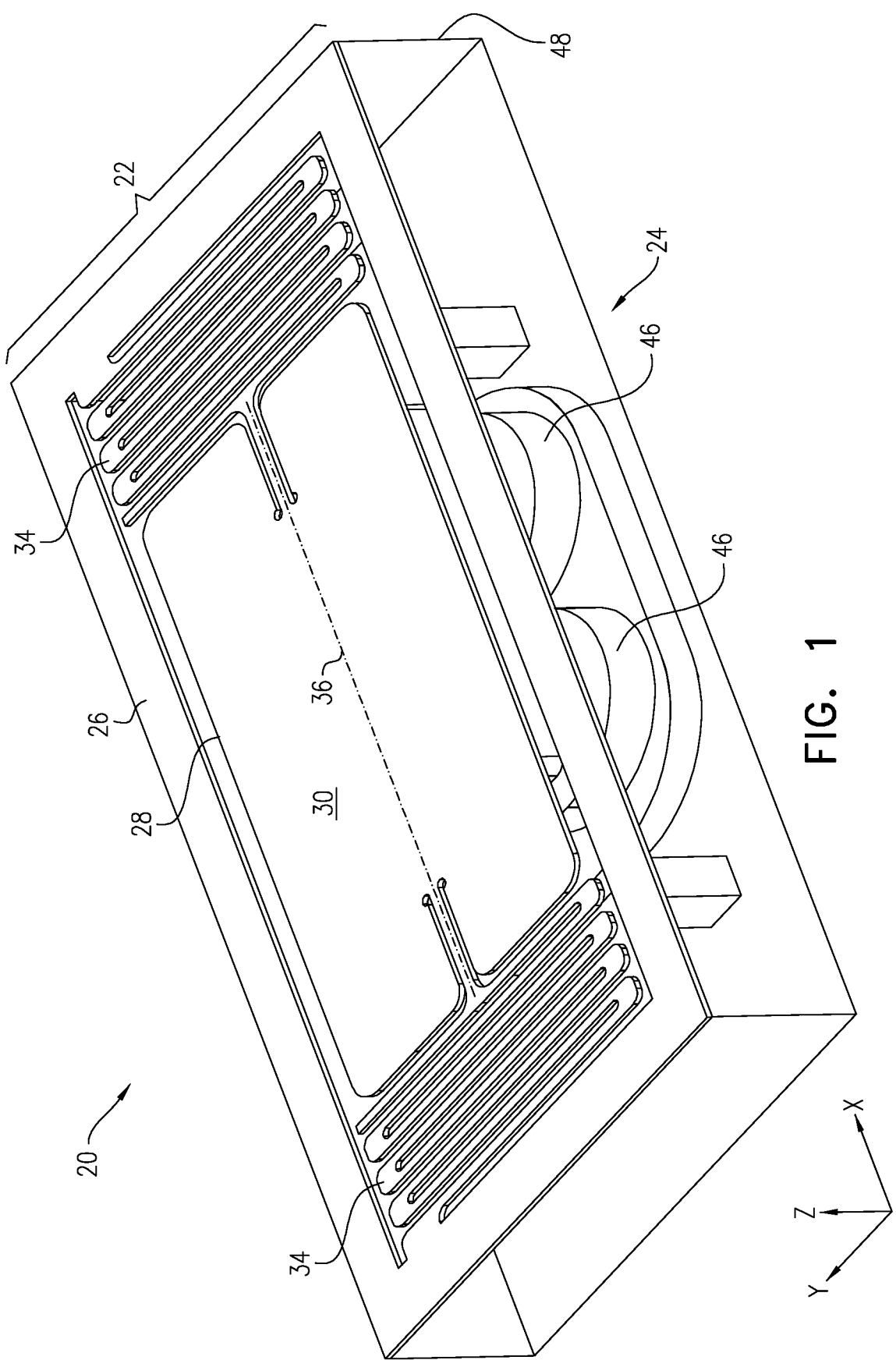
FIG. 1 is a schematic, pictorial illustration of an optical scanning device, in accordance with an embodiment of the present invention.

Scanning micromirror devices produced by MEMS processes have advantages of small size, light weight, and low manufacturing cost, and they can be designed to operate at high scanning speeds. As size decreases and scanning rate increases, however, such devices suffer from problems of rapid wear and short operating life. Larger, heavier scanning micromirrors may have increased lifespan but generally consume more electrical power in driving the scan.

Embodiments of the present invention that are described herein alleviate these problems in a novel design in which mechanical and magnetic forces on the micromirror are balanced, so that only minimal energy investment is required to rotate the mirror. This design reduces the stress on the flexures holding the micromirror in its frame, and thus lengthens the device lifetime while allowing the micromirror to be scanned over a wide range of frequencies. Scanners of this sort can be produced using a variety of MEMS processes, such as etching a silicon wafer or etching a sacrificial dielectric layer in a LIGA process, followed by electroplating of a metal and removal of the sacrificial layer, as is known in the art.

In the disclosed embodiments, a planar scanning mirror having a reflective upper surface is contained within a frame. The mirror is connected to the frame by a pair of flexures, each having one end connected to the frame and the other connected to the mirror at opposing ends of the rotational axis of the mirror. The mirror is scanned by an electromagnetic drive, in which the rotor comprises a permanent magnet fixed to the lower surface of the mirror, while the stator comprises one or more pairs of cores disposed on opposing sides of the rotational axis of the mirror in proximity to the rotor, with coils of wire wound on the cores. The stator cores may be magnetized with a polarity chosen to repel the rotor; for example, the rotor and stator coils may have opposing polarities perpendicular to the plane of the frame. This magnetic force, together with the mechanical resilience of the flexures, causes the micromirror to "levitate" within the frame, so that only small forces are needed to deflect the micromirror relative to this plane.

The deflecting forces are provided by a drive circuit, which drives the stator coils with respective electrical currents comprising parallel and anti-parallel components. The anti-parallel component induces a torsional force on the rotor about the rotational axis and thus controls the rotation of the micromirror about the axis. This anti-parallel component can be modulated to set the frequency and amplitude of rotational scanning of the micromirror. The parallel component of the drive current induces a transverse force, perpendicular to the plane of the frame, and thus controls the transverse displacement of the mirror relative to this plane. This parallel component thus sets the location at which the micromirror "levitates" (even if the stator cores are not magnetized) and can be used, for example, to adjust the focal distance of the scanning device.

Figure 2:
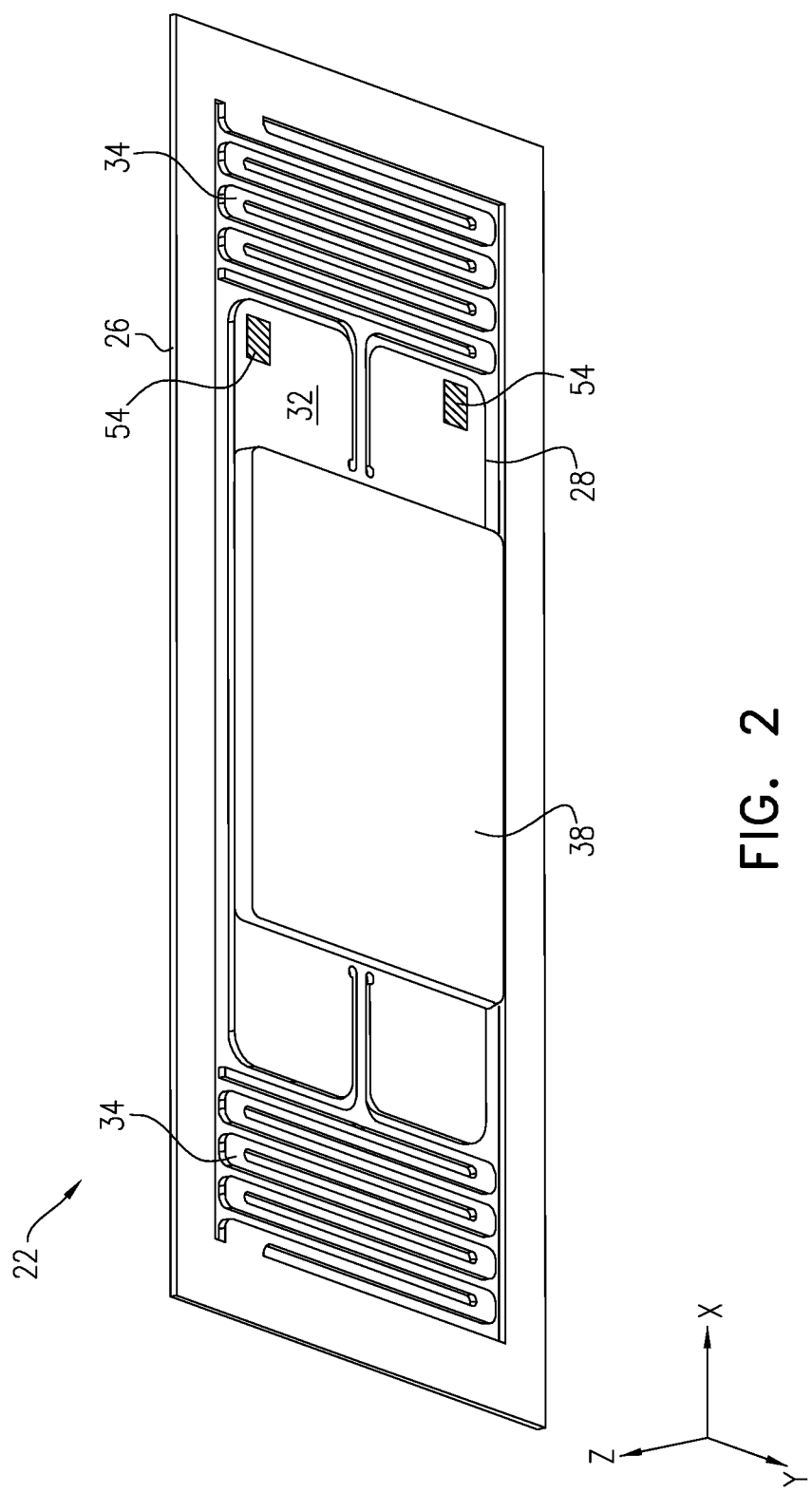
FIG. 2 is a schematic, pictorial illustration of a scanning micromirror assembly, seen from below, in accordance with an embodiment of the invention.
Figure 3:
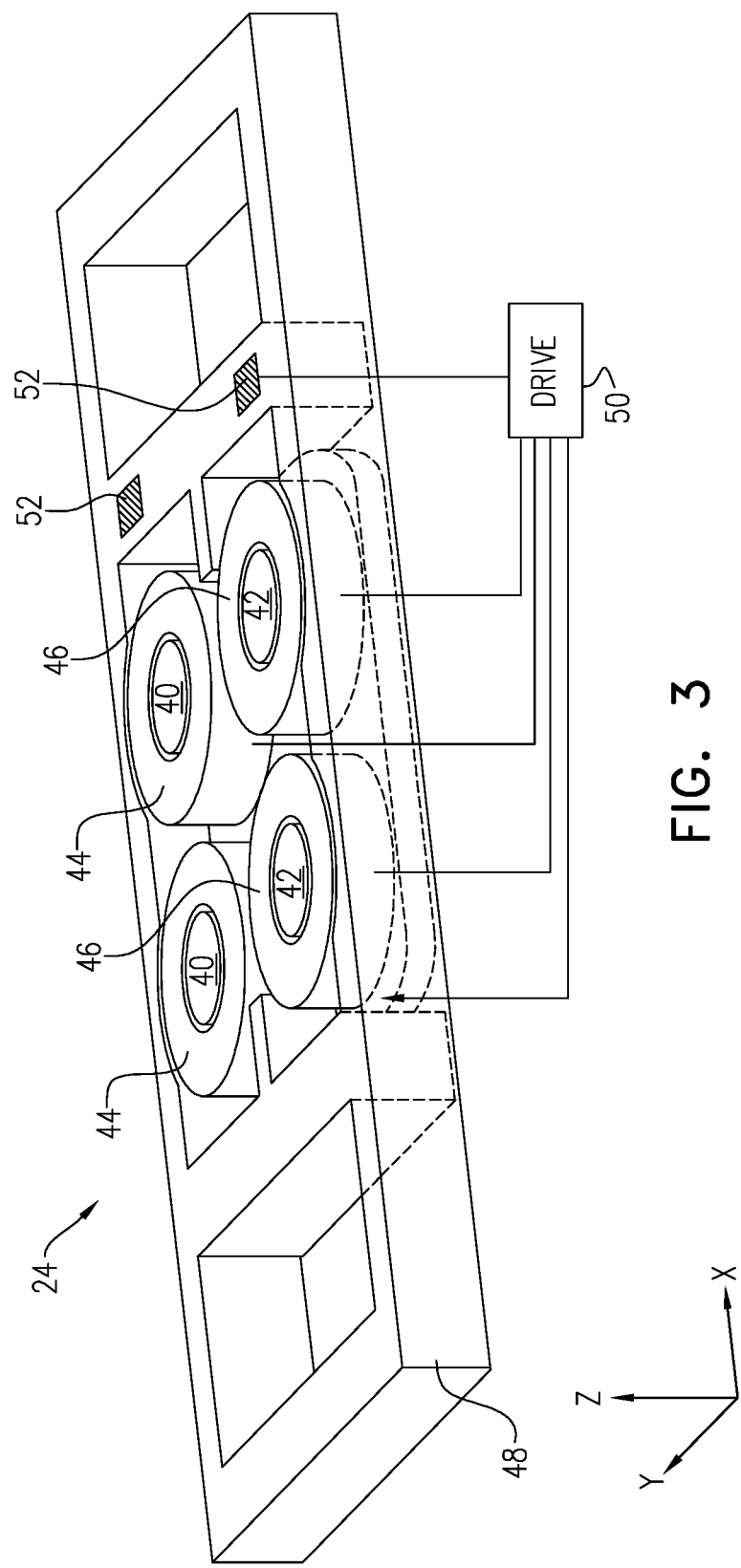
FIG. 3 is a schematic, pictorial illustration of an electromagnetic stator assembly for use in an optical scanning device, in accordance with an embodiment of the invention.

Reference is now made to FIGS. 1-3, which are schematic, pictorial illustrations of an optical scanning device 20, in accordance with an embodiment of the present invention. FIG. 1 presents an overview of device 20. FIG. 2 shows details of a scanning micromirror assembly 22, seen from below, in device 20. FIG. 3 shows an electromagnetic stator assembly 24 in device 20. (Terms referring to orientation in the present description, such as "upward," "above" and "below," are used solely for the sake of convenience in reference to the viewing perspectives shown in the figures, as are the X, Y and Z axes identified in the figures. The positive Z-direction is arbitrarily taken, in this context, to be the upward direction. In practice, device 20 may operate in substantially any orientation.)

Device 20 can be particularly useful as a part of a scanning 3D mapping system or other depth-sensing (LIDAR) device, in conjunction with a suitable optical transmitter, receiver, and control and processing circuits, as are known in the art. (Details of these components are omitted from the figures, however, for the sake of simplicity.) Alternatively, device 20 may be adapted for use in scanning optical beams in other applications.

Micromirror assembly 22 comprises a frame 26, with a planar scanning mirror 28 (typically a micromirror, depending on the dimensions) contained within the frame. Mirror 28 has a reflective upper surface 30, which can be formed, for example, by plating or otherwise depositing a thin metal layer over the upper surface of the material from which frame 26 is made. Mirror 28 is connected to frame 26 by a pair of flexures 34, each having an outer end connected to the frame and an inner end connected to mirror 28, at opposing ends of a rotational axis 36 of the mirror. Flexures 34 have a serpentine shape, which permits both torsional motion or mirror 28 about axis 36 (which is parallel to the X-axis in the figures) within frame 26 and transverse motion out of the plane of frame 26 (along the Z-axis). These motions are illustrated specifically in FIGS. 4 and 5. Alternatively, other flexure designs that permit these two modes of motion can be used.

To drive the rotational and transverse motions of mirror 28, a rotor 38, comprising a permanent magnet, is fixed to a lower surface 32 of mirror 28. For example, mirror 28 may be about 25 μm thick, while the magnetic material of rotor is about 100 μm thick and is poled along a magnetic axis perpendicular to the plane of frame 26, i.e., in the +Z-direction. This magnetic material may comprise electroplated nickel, which also provides structural support for the thin mirror. The overall size of micromirror assembly 22 in this example is 3×12 mm. Alternatively, other dimensions and configurations may be used.

Stator assembly 24 comprises pairs of cores 40 and 42, which are disposed in proximity to rotor 38 on opposing sides of rotational axis 36 of mirror 28. In the pictured example, the stator assembly comprises two cores 40 and two corresponding cores 42 on opposite sides of axis 36; but alternatively, larger or smaller numbers of cores may be used. Cores 40 and 42 comprise a ferromagnetic material, which is magnetically poled in the opposite direction (the −Z-direction in the present example) from rotor 38. (Alternatively, the cores may have no permanent magnetic polarization.) Cores 40 and 42 are wound respectively with wire coils 44 and 46. In the pictured embodiment, the elements of stator assembly 24 are contained in a housing 48, which can be made from a ceramic material, for example, with frame 26 attached to the upper edge of the housing.

A drive circuit 50 drives coils 44 and 46 with respective electrical currents, which give rise to corresponding magnetic fields along the Z-axis. Drive circuit 50 comprises, for example, a DC power source, modulation circuits (digital or analog) for creating the desired drive waveforms, and amplifiers coupled to the modulation circuits for generating output currents in the appropriate amplitude range. (These elements are well known to those skilled in the art and are omitted from the figures for the sake of simplicity.) As noted earlier, the output currents typically comprise a parallel component, which flows in coils 44 and 46 in the same direction, and an anti-parallel component, which flows in coils 44 and 46 in opposite directions.

The parallel component of the current gives rise to a magnetic field along the Z-axis emanating from all of cores 40 and 42. At the baseline position of mirror 28, for example with mirror 28 in the plane of frame 26, the parallel drive current is set so that this magnetic field balances the repulsion between stator 38 and the permanent magnetic field of cores 40 and 42, and the mirror thus "levitates" in this position. Drive circuit 50 can vary the magnitude and direction of the parallel current component so as to control the transverse displacement of mirror 28 relative to the plane of frame 26.

The antiparallel component of the current gives rise to magnetic fields in opposite directions on the opposing sides of axis 36, and thus to rotation of mirror 28 about the axis. The amplitude and frequency of this antiparallel current determine the rate and amplitude of rotational scanning of the mirror.

One or more sensors can be used to monitor the transverse displacement and rotation of mirror 28 relative to frame 26, and to output corresponding signals to drive circuit 50. Capacitive sensors may be used for this purpose, for example in the form of electrodes 52 and 54 that are deposited on housing 48 and on lower surface 32 of mirror 28. The changes in capacitance as a function of the varying distance between electrodes 52 and 54 provide feedback to drive circuit 50, which then generates the electrical currents accordingly to position and rotate mirror 28 as desired.

Various manufacturing processes can be used in producing micromirror assembly 22. For example, frame 26, mirror 28, and flexures 34 may comprise silicon, which is formed by etching a silicon wafer in a MEMS process. Alternatively, frame 26, mirror 28, and flexures 34 may comprise a metal, which may have a thickness less than 100 µm. The metal may be formed in a LIGA process, as is known in the art, in which a sacrificial dielectric material, such as a suitable photoresist, is patterned and etched in a photolithographic process to define the shape of the micromirror assembly. A metal, such as nickel, is electroplated onto the etched sacrificial dielectric material, and the sacrificial dielectric material is then removed, for example in a solution of NaOH. The residual stresses in micromirror assembly 22 following this process are negligible. Further alternatively, the metal may comprise a thin metal sheet, such as a copper-titanium alloy, which is etched and cut to the desired shape. Other manufacturing processes that can be used in fabricating micromirror assembly 22 will be apparent to those skilled in the art after reading the present description and are considered to be within the scope of the present invention.

Figure 4:
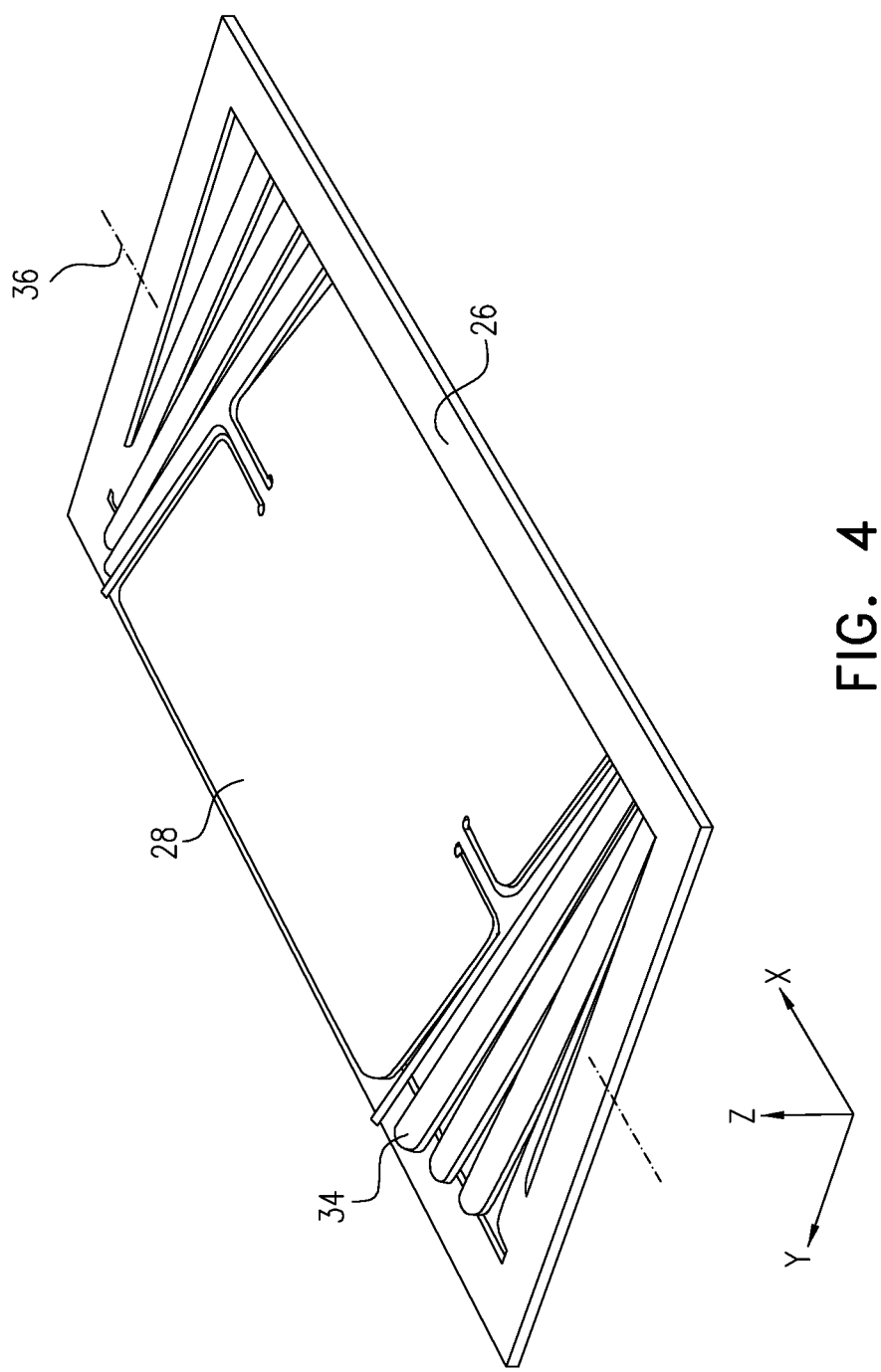
FIG. 4 is a schematic pictorial illustration showing rotational movement of a micromirror, in accordance with an embodiment of the invention.
Figure 5:
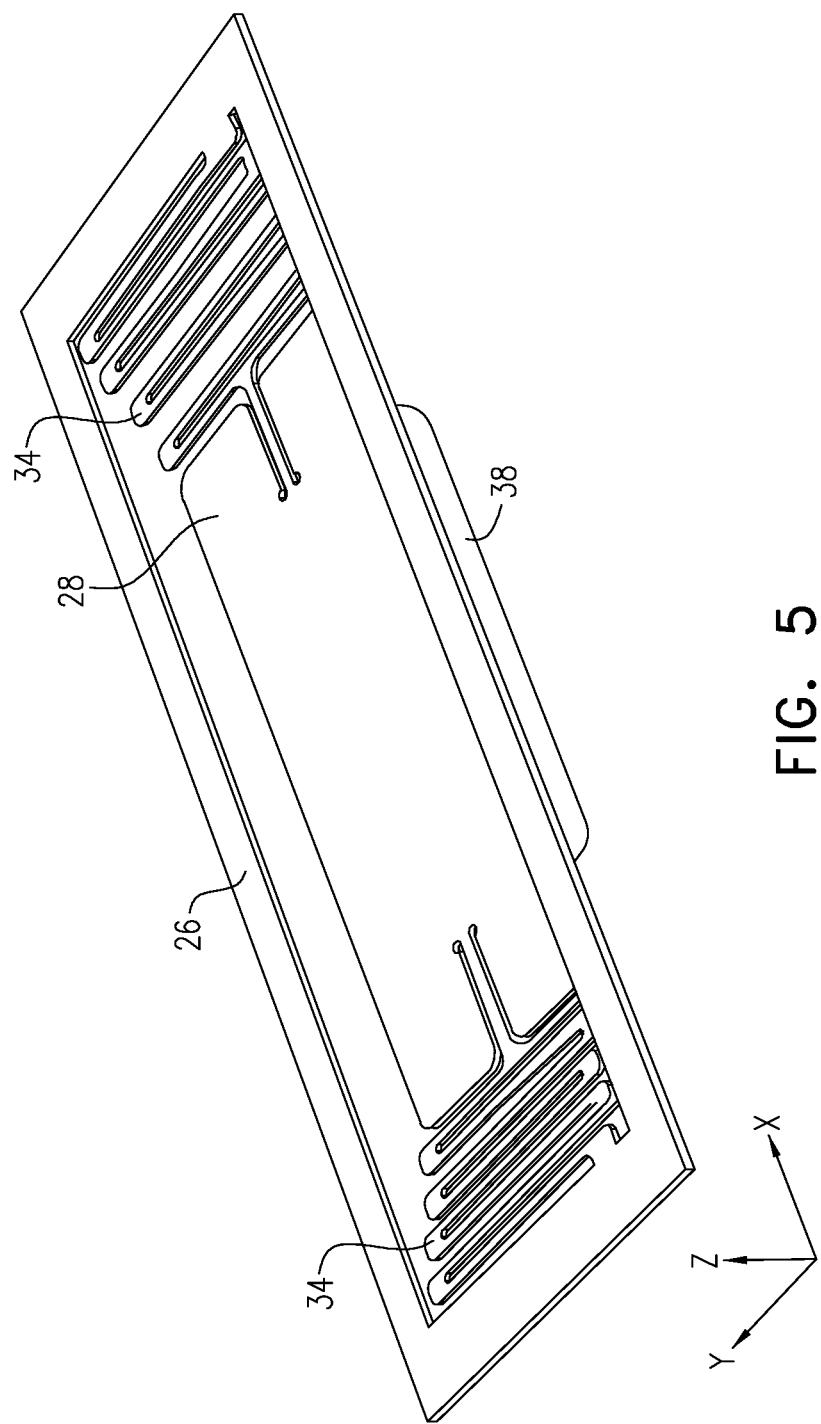
FIG. 5 is a schematic pictorial illustration showing transverse displacement of a micromirror, in accordance with an embodiment of the invention.

FIGS. 4 and 5 are schematic pictorial illustrations showing rotational movement and transverse displacement of mirror 28, respectively, in accordance with an embodiment of the invention. These figures are simulations, assuming frame 26 to be made from a thin layer of plated nickel. FIG. 4 shows a rotation of 21° about axis 36, which is induced by an applied torque of only 0.65 µN*m. The maximum stresses on the spring elements in flexures 34 are about 110 MPa. FIG. 5 shows a transverse displacement of about 55 µm, with a spring constant of 18 N/m in flexures 34.

Although the above description and the figures show one particular design of optical scanning device 20, the principles of the present invention may similarly be implemented in devices of other sizes and shapes. It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A scanning device, comprising:
   a frame defining a plane;
   a planar scanning mirror disposed within the frame and having a baseline position in the plane of the frame, the mirror having a reflective upper surface and a lower surface opposite the upper surface;
   a pair of flexures having respective first ends connected to the frame and respective second ends connected to the planar scanning mirror at opposing ends of a rotational axis of the planar scanning mirror;
     a rotor comprising a permanent magnet disposed on the lower surface of the planar scanning mirror;
   a stator, comprising:
     first and second cores disposed in proximity to the rotor on opposing first and second sides of the rotational axis of the planar scanning mirror; and
     first and second coils of wire wound respectively on the first and second cores; and
   a drive circuit, which is configured to drive the first and second coils with respective electrical currents comprising a first component selected so as to control a transverse displacement of the planar scanning mirror perpendicular to the plane of the frame and a second component selected so as to control a rotation of the planar scanning mirror about the rotational axis.

2. The device according to claim 1, wherein the flexures have a serpentine shape.

3. The device according to claim 1, wherein the first and second cores are magnetized with a polarity selected so as to repel the permanent magnet in the rotor.

4. The device according to claim 3, wherein the permanent magnet in the rotor and the first and second cores are poled in opposite directions along a magnetic axis perpendicular to the plane of the frame.

5. The device according to claim 1, wherein the stator further comprises third and fourth cores disposed in proximity to the rotor on opposing first and second sides of the rotational axis of the planar scanning mirror in respective proximity to the first and second cores, and third and fourth coils of wire wound respectively on the third and fourth cores.

6. The device according to claim 5, wherein the drive circuit is coupled to drive the third and fourth coils together with the first and second coils, respectively.

7. The device according to claim 1, and comprising one or more capacitive sensors configured to output signals indicative of the transverse displacement and rotation of the planar scanning mirror, wherein the drive circuit is configured to generate the electrical currents responsively to the signals.

8. The device according to claim 1, wherein the frame, the planar scanning mirror, and the flexures are etched from a silicon wafer.

9. The device according to claim 1, wherein the frame, the planar scanning mirror, and the flexures comprise a metal having a thickness less than 100 μm.

10. The device according to claim 1, wherein the drive circuit is coupled to drive the first and second coils such that the first component of the electrical currents flows through the first and second coils in a parallel direction, while the second component of the electrical currents flows through the first and second coils in an anti-parallel direction.

11. A method for scanning, comprising:
mounting a planar scanning mirror, having a reflective upper surface and a lower surface opposite the upper surface, within a frame defining a plane by connecting respective first ends of a pair of flexures to the frame and connecting respective second ends of the flexures to the planar scanning mirror at opposing ends of a rotational axis of the planar scanning mirror, which has a baseline position in the plane of the frame;
fixing a rotor comprising a permanent magnet to the lower surface of the planar scanning mirror;
placing first and second cores of a stator, on which first and second coils of wire are respectively wound, in proximity to the rotor on opposing first and second sides of the rotational axis of the planar scanning mirror; and
driving the first and second coils with respective electrical currents comprising a first component selected so as to control a transverse displacement of the planar scanning mirror perpendicular to the plane of the frame and a second component selected so as to control a rotation of the planar scanning mirror about the rotational axis.

12. The method according to claim 11, wherein the frame, the planar scanning mirror, and the flexures are formed by etching a silicon wafer in a MEMS process.

13. The method according to claim 11, wherein the frame, the planar scanning mirror, and the flexures are formed by etching a sacrificial dielectric material, electroplating a metal onto the etched sacrificial dielectric material, and removing the sacrificial dielectric material in a LIGA process.

14. The method according to claim 11, wherein the frame, the planar scanning mirror, and the flexures are formed by etching and cutting a metal sheet.

15. The method according to claim 11, wherein driving the first and second coils comprises applying the first component of the electrical currents to flow through the first and second coils in a parallel direction, while applying the second component of the electrical currents to flow through the first and second coils in an anti-parallel direction.

16. The method according to claim 11, wherein the flexures have a serpentine shape.

17. The method according to claim 11, wherein the first and second cores are magnetized with a polarity selected so as to repel the permanent magnet in the rotor.

18. The method according to claim 17, wherein the permanent magnet in the rotor and the first and second cores are poled in opposite directions along a magnetic axis perpendicular to the plane of the frame.

19. The method according to claim 11, wherein the stator further comprises third and fourth cores disposed in proximity to the rotor on opposing first and second sides of the rotational axis of the planar scanning mirror in respective proximity to the first and second cores, and third and fourth coils of wire wound respectively on the third and fourth cores, and wherein the method comprises driving the third and fourth coils together with the first and second coils, respectively.

20. The method according to claim 11, wherein driving the first and second coils comprises receiving signals from one or more capacitive sensors indicative of the transverse displacement and rotation of the planar scanning mirror, and generating the electrical currents responsively to the signals.

\* \* \* \* \*